United States Patent [19]

Takahashi et al.

[11] Patent Number: 5,552,716
[45] Date of Patent: Sep. 3, 1996

[54] METHOD OF POSITIONING AN ELECTROOPTIC PROBE OF AN APPARATUS FOR THE MEASUREMENT OF VOLTAGE

[75] Inventors: Hironori Takahashi; Shinichiro Aoshima; Isuke Hirano; Yutaka Tsuchiya, all of Hamamatsu, Japan

[73] Assignee: Hamamatsu Photonics K.K., Hamamatsu, Japan

[21] Appl. No.: 213,005

[22] Filed: Mar. 14, 1994

[30] Foreign Application Priority Data

Mar. 15, 1993 [JP] Japan .................................. 5-054225

[51] Int. Cl.$^6$ .................................................. G01R 29/12
[52] U.S. Cl. ............................................ 324/753; 324/751
[58] Field of Search ............................ 324/753, 96, 751, 324/662, 689; 359/245; 250/306, 307, 310, 311

[56] References Cited

U.S. PATENT DOCUMENTS

| 4,446,425 | 5/1984 | Valdmanis et al. . |
| 4,618,819 | 10/1986 | Mourou et al. . |
| 5,274,325 | 12/1993 | Shinagawa et al. ...................... 324/96 |

FOREIGN PATENT DOCUMENTS

| 0580446 | 1/1994 | European Pat. Off. . |
| 1110743 | 4/1989 | Japan . |
| 2238382 | 9/1990 | Japan . |
| 572299 | 3/1993 | Japan . |

OTHER PUBLICATIONS

Patent Abstracts Of Japan, vol. 10, No. 371 (P–526) Dec. 11, 1986 & JP–A–61 165 607 (Hitachi) Jul. 26, 1986.

Shinagawa et al, "An Automated Optical On–Wafer Probing System for Ultra∝High–Speed ICs", International Test Conferene 1992, Sep. 1992, pp. 834–839.

Nagatsuma, "Measurement of High–Speed Devices and Integrated Circuits Using Electro–optic Sampling Technique", IEICE Transactions On Electronics, vol. E76–C, No. 1, Jan. 1993, pp. 55–63.

Aoshima et al, "Non–Contact Picosecond Electro–Optic Sampling Utilizing Semiconductor Laser Pulses", SPIE Ultra High Speed and High Speed Photography, Photonics, and Videography '89, vol. 1155, 1989, pp. 499–510 (Month Unavailable).

Tadao Nagatsuma, "Measurement Of High–Speed Devices And Integrated Circuits Using Electro—Optic Sampling Technique", IEICE Trans, Electron, vol. E76–C, No. 1, Jan. 1, 1993, pp. 55–63.

(List continued on next page.)

*Primary Examiner*—Kenneth A. Wieder
*Assistant Examiner*—Barry C. Bowser
*Attorney, Agent, or Firm*—Cushman Darby & Cushman, L.L.P.

[57] ABSTRACT

An method of positioning an E-O probe applied to an apparatus for the measurement of voltage. In the first step, the relative position of the E-O probe against the magnifying optical system in the first condition of being focused the magnifying optical system on the base of the E-O probe, and the focal point difference between the focal plane of the magnifying optical system in the second condition that the E-O probe is substantially out of the optical path for observation of the surface of the device and the focal plane in the first condition are stored. The relative position and the focal point difference are fixed in the apparatus for the measurement of voltage regardless of the device to be measured. Next, in the second step, the focus of the magnifying optical system is adjusted to the observation position of the surface of the device in the second condition, and then in the third step, the magnifying optical system, the E-O probe, and the probe stage are separated from the device by the focal point difference stored in the first step by the Z-axis stage, and in the fourth step, the E-O probe is moved to the relative position of the E-O probe stored in the first step relative to the magnifying optical system by the probe stage.

6 Claims, 3 Drawing Sheets

OTHER PUBLICATIONS

Tadao Nagatsuma, "Subpicosecond Sampling Using A Noncontact Electro–Optic Probe", J. Appl. Phys. 66(9), Nov. 1, 1989, pp. 4001–4009.

Mitsuru Shinagawa et al, "A Laser–Diode–Based Picosecond Electrooptic Prober For High–Speed LSI'S", IEEE Transactions On Instrumentation and Measurement, vol. 41, No. 3, Jun. 3, 1992, pp. 375–380.

Janis A. Valdmanis et al, "Subpicosecond Electrooptic Sampling: Principles And Applications", IEEE Journal of Quantum Electronics, vol. QE–22, No. 1, Jan. 1986, pp. 69–78.

Fig. 2

| Operation items | (1) Movement of measuring point | (2) Determination of measuring point | (3) Preparation for measurement | (4) At measurement | (5) End of measurement |
|---|---|---|---|---|---|
| Microscope XY direction / Z direction | Move / Auto focusing Zo | Stop / Stop Zo | Stop / Move Zo+ΔZ | Stop / Stop Zo+ΔZ | Stop / Stop Zo+ΔZ |
| Probe Z direction | Ho − ΔH | Ho − ΔH | Ho − ΔH | Ho | Move Ho − ΔH |
| TV monitor 63 | Pattern of IC | Pattern of IC | Out of focus | Base of probe | Out of focus |
| Monitor of computer 62 | Monitoring image | Freezing image | Freezing image | Freezing image | Monitoring image |
| Relative position | | | | | |

METHOD OF POSITIONING AN ELECTROOPTIC PROBE OF AN APPARATUS FOR THE MEASUREMENT OF VOLTAGE

BACKGROUND OF THE INVENTION

1. Field of the Invention

The present invention relates to an apparatus for the measurement of voltage which measures the voltage of a device such as an IC (integrated circuit) without contact using an electrooptic effect, and specifically to a method of positioning an electrooptic (E-O) probe thereof.

2. Related Background Art

One feature of such an apparatus for the measurement of voltage is having an E-O probe which comprises on electrooptic crystal, the refractive index of which is varied when the voltage is applied. If the voltage is applied to a device to be measured while the E-O probe is close to the device, an electric field in the electro-optic crystal is varied, whereby the refractive index of the crystal is varied. At this point, if light (usually produced in the form of a laser beam) enters into the E-O probe, the state of the light polarization is varied by a change of the refractive index of the crystal in accordance with the applied voltage. Accordingly, if the light which is reflected by a base of the probe and returns is removed by the polarization beam splitter through the wave plate, a change of the applied voltage can be detected as a change in light intensity. Here, a laser source for the measurement may be a continuous wave (CW) source or a pulsed source.

The detecting sensitivity of the apparatus for the measurement of voltage depends on the distance between the E-O probe and the device to be measured. Accordingly, it is important to set the distance accurately. A solution in a conventional case is, for example, to use a double-focus lens as disclosed in:

"J. Appl. Phys. 66 (9), Nov. 1, 1989 pp. 4001–4009", or to use a balance disclosed in the following reference "IEEE TRANSACTIONS ON INSTRUMENTATION AND MEASUREMENT, VOL. 41, NO. 3, JUNE 1992, pp. 375–380".

However, in the former conventional case, an E-O probe can be positioned without contact with the device to be measured, but there is one fault: a special double-focus lens is required. Further, in the latter conventional case, in order to set the position of the E-O probe, the E-O probe is brought into contact with the device to be measured once to obtain the reference position, and based on the reference position, the position of the E-O probe is determined. In this case, its structure is very complicated in order to decrease the damage caused by the contact. Specifically, the E-O probe must be fixed at the cylinder which can move up and down in a nearly frictionless state with air blown between the cylinder and an air guide. Their effective mass must be reduced by the balance system. Moreover, the slight vertical movement of the E-O probe is needed for operation by a piezo element fixed at the cylinder, and the position of the E-O probe is required to be read by a position scale installed at the cylinder. Thus, in the latter case, since the peripheral systems of the E-O probe were very complicated and large, the number of electrical pins which provide voltage or signal could not be set around the E-O probe. Further, since the E-O probe is brought into contact with the device to be measured prior to the measurement, there was a danger of breaking the device.

SUMMARY OF THE INVENTION

It is an object of the present invention to provide a method of positioning an E-O probe of an apparatus for the measurement of voltage which does not require a special optical system and which can position the E-O probe without contact with a device to be measured.

Provided according to the present invention is a method of positioning an E-O probe applied to an apparatus for the measurement of voltage comprising a magnifying optical system for observing a surface of a device to be measured in focus, an E-O probe, a laser beam for the measurement of voltage of the device entering thereto in the state where the E-O probe approximates to said device, a probe stage for moving the E-O probe in a direction along an optical axis of said magnifying optical system against said system, and a Z-axis stage for moving the magnifying optical system, the E-O probe and the probe stage in a direction along an optical axis of the magnifying optical system against the device, method of positioning said E-O probe comprising a first step of storing relative positions of the E-O probe against the magnifying optical system in the first condition of the magnifying optical system by focusing at a base of the E-O probe and storing the focal point difference between a focal plane of the magnifying optical system in the second condition of the E-O probe substantially out of an optical path for observing the surface of the device and a focal plane in the first condition. A second step of adjusting the focus of the magnifying optical system to an observation position on the device is performed next. Next a third step of separating the magnifying optical system, the E-O probe and said probe stage from the device by the focal point difference stored in the first step by the Z-axis stage. A fourth step of moving E-O probe to the relative position of E-O probe stored in the first step against said magnifying optical system by the probe stage is performed last.

According to a configuration of the present invention, in the first step, the relative position of the E-O probe against the magnifying optical system in the first condition of focusing the magnifying optical system on the base of the E-O probe, and the focal point difference between the focal plane of the magnifying optical system in the second condition that the E-O probe is substantially out of the optical path for observation of the surface of the device and the focal plane in the first condition are stored. The relative position and the focal point difference are fixed in the apparatus for the measurement of voltage regardless of the device to be measured. Next, in the second step, the focus of the magnifying optical system is adjusted to the observation position of the surface of the device in the second condition, and then in the third step, the magnifying optical system, the E-O probe, and the probe stage are separated from the device by the focal point difference stored in the first step by the Z-axis stage, and in the fourth step, the E-O probe is moved to the relative position of the E-O probe stored in the first step relative to the magnifying optical system by the probe stage. Thus, the E-O probe is set at the position close to the device, and the focal plane comes to the base of the E-O probe.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 2 is a view showing the measurement procedure according to a method of an embodiment of the present invention.

DETAILED DESCRIPTION OF THE PREFERRED EMBODIMENTS

The embodiments of the present invention will be described hereunder.

Figure 1:
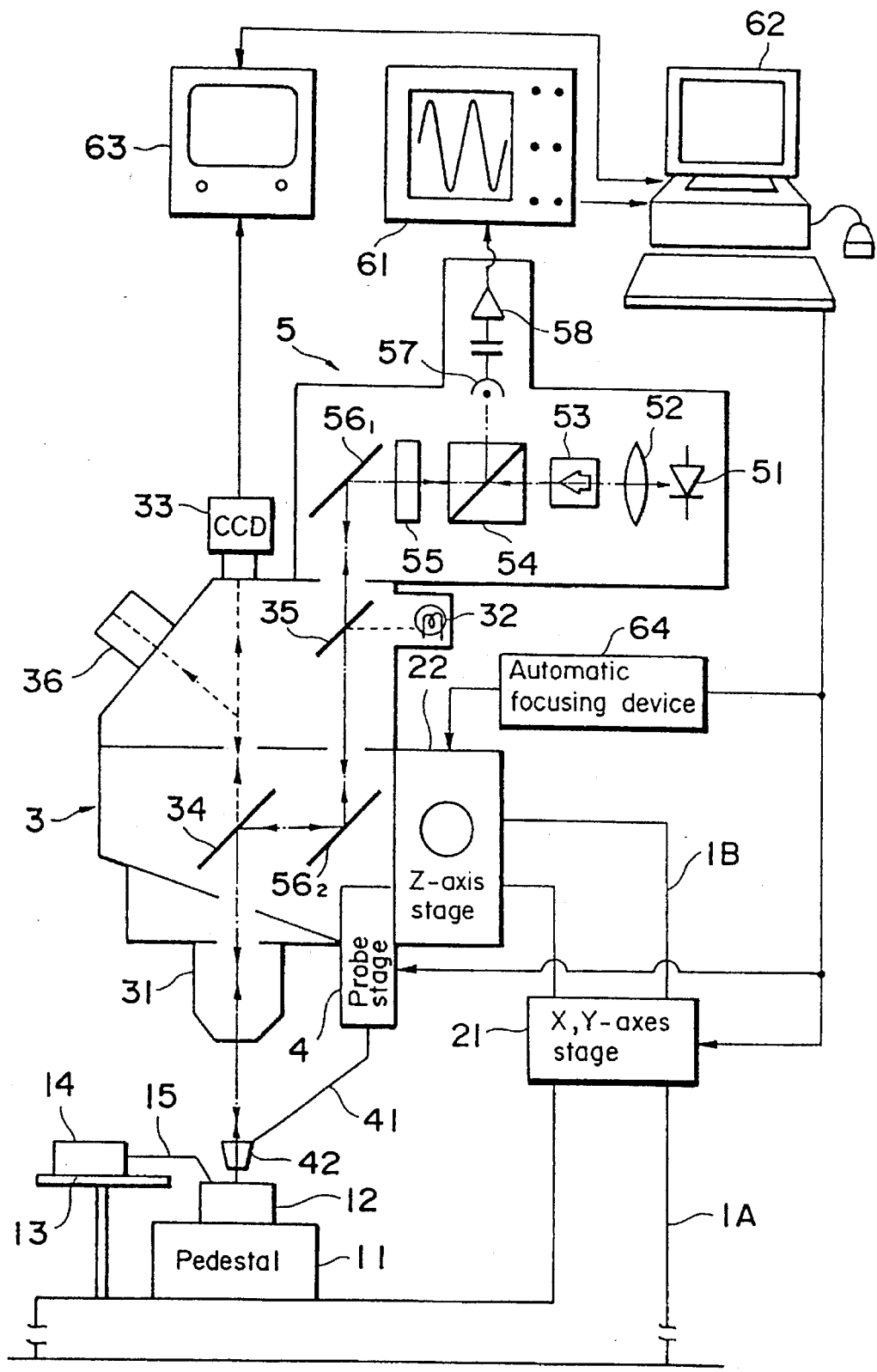
FIG. 1 is a configuration of an apparatus for the measurement of voltage to which a method of an embodiment is applied.

FIG. 1 shows the whole structure of an apparatus for the measurement of voltage to which a positioning method of the present embodiment is applied. As shown in FIG. 1, a pedestal 11 is placed on an upper surface of a holddown body part 1A and a device 12 to be measured is set on the pedestal 4. Further, an operation table 13 is fixed on the holddown body part 1A nearby the pedestal 11, and a manipulator 14 is installed on the operation table 13. Then, an electrical pin 15 is placed on the manipulator 14, which provides a power supply or a signal input to the device.

An X-Y axes stage 21 is installed at a pillar part of the holddown body part 1A, and a moveable body part 1B is installed on the X-Y axes stage 21. And Z-axis stage 22 is installed at the moveable body part 1B. Then, a microscope unit 3 is installed at the Z-axis stage 22, and a probe stage 4 is fixed at the microscope unit 3. A support pin 41 of tungsten extends from the probe stage 4, and the E-O probe 42 is supported by the end of the support pin 41.

The microscope unit 3 comprises an objective lens 31 which faces a surface of the device 12 through the E-O probe 42. Further, the microscope unit 3 comprises a lighting source 32 for providing lighting on the surface of the device 12, a CCD camera 33 for taking an image of the surface of the device 12, and an eyepiece 36. Note that for the E-O probe 42 of ZnTe crystal, a visible-ray camera is used as the CCD camera 33, and for GaAs crystal, an infrared camera is used.

The microscope unit 3 comprises dichroic mirrors 34 and 35 which couple the above lighting source and the imaging system, and a laser optical system for the voltage measurement which will be described later. That is, the dichroic mirror 34 transmits 50% of light of the wavelength from the lightening source 32 and reflects light from a laser beam source (described later). Further, the dichroic mirror 35 reflects light of the wavelength from the lighting source 32, and transmits light of the wavelength from the laser beam source. As described above, the objective lens 31 is used for both lighting and taking the image of the device 12, and radiating laser beams for the voltage measurement.

A voltage measuring unit 5 which is operated by a laser beam is installed at the microscope unit 3. Light coming out from the CW laser diode 51 goes to an optical isolator 53 through the lens 52. The optical isolator 53 transmits light only in one direction, and the transmitting light passes through a polarization beam splitter 54 and a ⅛-wave plate 55, and its light path is changed by mirrors $56_1$ and $56_2$. Then, the light is reflected by the dichroic mirror 34, passes through the magnifying lens system 31, and goes to the E-O probe 42. The laser beams reflected by the bottom surface of the E-O probe 10 pass the magnifying lens system 31 again and ⅛-wave plate 55, then goes into polarization beam splitter 54. At this point, because the laser beams pass the ⅛-wave plate 55 twice, it is shifted by quarter-wave in phase, whereby the laser beams are circularly polarized. Accordingly, half of the incident laser beams to the polarization beam splitter 54 is reflected here and goes to the photodiode 57. Then, an output of the photodiode 57 is amplified by an amplifier 58 and is output to the outside.

Here, the principle of the measurement of the voltage $V_{in}$ will be described briefly. If the voltage $V_{in}$ is applied to an electrode (not shown) on the surface of the device 12, the refractive index of the E-O probe 42 neighboring the electrode is changed by an electro-optic effect. Then, the laser beams (linearly polarized) are polarized while traveling back and forth through the crystal. Therefore, the ratio of the laser beam reflected by the polarization beam splitter 54 and going to the photodiode 57 is changed, so that the voltage $V_{in}$ of the device 12 can be measured from the output of the photodiode 57.

The measurement results are displayed on a digital oscilloscope 61, and processed by a computer 62. Note that the monitoring image taken by a CCD camera 33 is displayed on a TV monitor 63. Here, the TV monitor 63 comprises memories for picture, so that the obtained image can be stored therein as a still picture (freezing image), and displayed thereon. Alternately, the monitoring image taken by the CCD camera 33 is entered and stored in the computer 62, and then displayed on a monitor of the computer 62, or on the TV monitor 63.

The computer 62 controls the Z-axis stage 22 by using an automatic focusing device 64, and further controls the X-Y axes stage 21 and the probe stage 4. As described above, features of the apparatus to which the embodiments of the present invention are applied are that the microscope system including an objective lens for focusing the incident light to the E-O probe 42 has the automatic focusing function, and that the probe stage 4 for holding the E-O probe 42 is assembled to the microscope system, and that the external control device which moves the E-O probe 42 and the microscope system up and down by the procedure described hereinafter is installed. Here, the CCD camera 33 takes the image observed by the microscope system, and based on the results of the image processing obtained from the information such as contrast of the image, the automatic focusing device 64 adjusts the focus of the image by moving the microscope system up and down.

Next, a positioning method of the present embodiment which is applied to the apparatus for the measurement of voltage as described above will be explained. FIG. 2 shows the measurement procedure and FIGS. 3(a)–3(c) show main parts of the procedure.

Figure 3A:
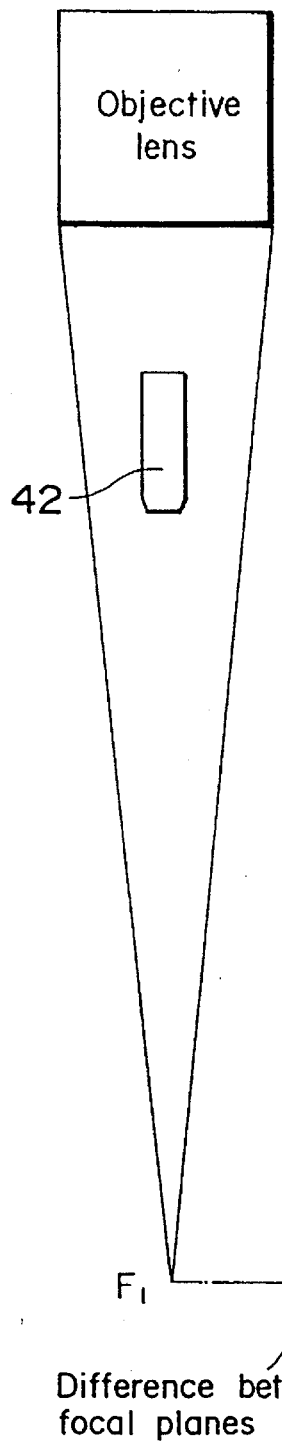
FIGS. 3(a)–3(c) are views for explaining main parts of FIG. 2.
Figure 3B:
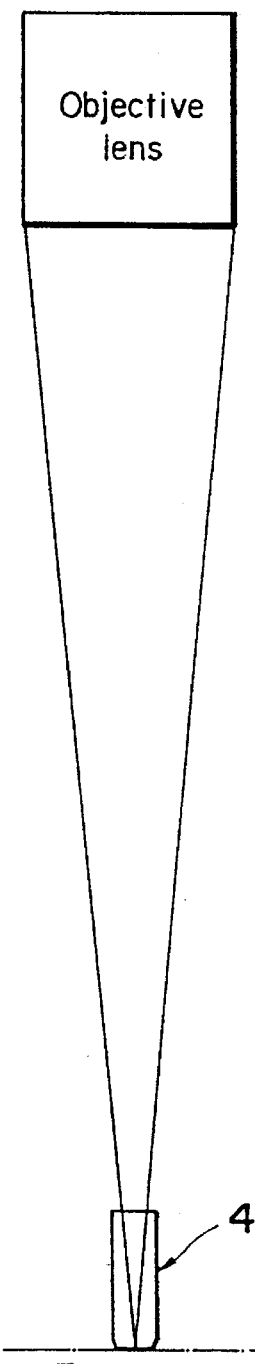
Figure 3C:
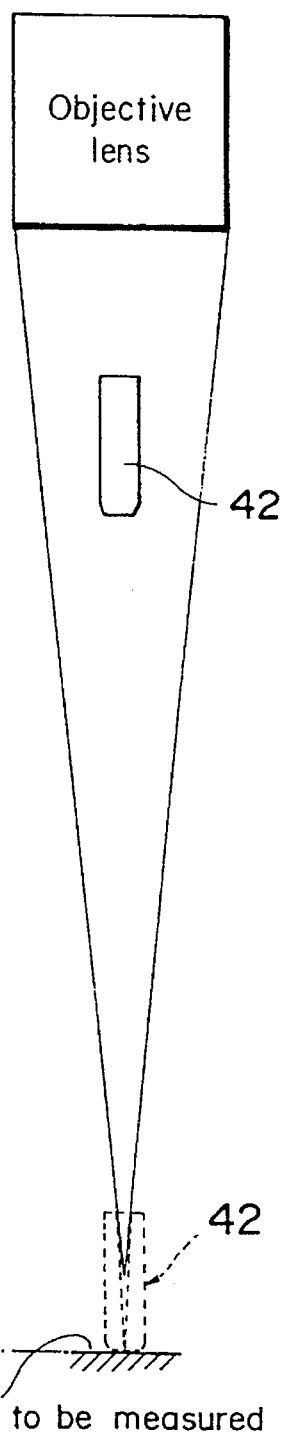

Referring to FIGS. 3(a)–3(c), the point will be explained briefly. First, as shown in of FIG. 3(a), when the E-O probe 42 is substantially out of sight of the magnifying lens system 31 (these are the cases where the E-O probe 42 is close to the objective lens 31 as shown in of FIG. 3(a) and cases where the E-O probe 42 is completely out of sight), the focal plane of the objective lens 31 is at $F_1$. On the other hand, when the E-O probe 42 is in the optical path, as shown in FIG. 3(b), the focal plane of the objective lens 31 comes to $F_2$, and a difference is made between $F_1$ and $F_2$. This is because the refractive index of the E-O probe is generally larger than that of air, so that if the E-O probe 42 is in the optical path, the length of the optical path becomes long. Then, shown as a solid line in of FIG. 3(c), the objective lens 31 is positioned against the device to be measured allowing the difference ($F_1$–$F_2$) of the focal planes, and the E-O probe 42 shown as a dotted line in of FIG. 3(c) is set, so that a laser beam for the measurement is focused on the base of the E-O probe 42.

Referring to the measurement procedure as shown in FIG. 2, the method of positioning as described above will be explained in detail. Prior to the measurement, initialization is required.

(A) Initialization

Initialization is to obtain the position $H_0$ of the probe stage 4 (more precisely, the amount of the downward movement of the E-O probe 42 by the probe stage 4) at the time of the measurement as shown in the operation item (4) of FIG. 2, to set the variation $\Delta H$ of the position of the probe stage 4 at the time of the preparation for the measurement (see operation item (1) of FIG. 2), and to obtain the focal point difference $\Delta Z$ of the objective lens 31 when the E-O probe 42 exists in the optical path and when the E-O probe 42 does not exist in the optical path (see the operation items (3)–(5) in FIG. 2). These values are set only once when the E-O probe 42 is replaced. Note that in the initialization, the device to be measured is not needed but the initialization is adjusted based on the image of the E-O probe 42 taken by the CCD camera 33, so that there is no danger of breaking the E-O probe 42.

He gives the amount of downward movement of the E-O probe 42 seen from the probe stage 4 at the time of measurement. $H_0$ is the position of the probe stage 4 when the focus of the objective lens 31 of the microscope is adjusted to the reflecting film on the base of the E-O probe 42 by moving the E-O probe 42 supported by the probe stage 4 in Z direction. Moreover, the lens 52 of the CW laser diode 51 is adjusted to make the smallest spot of the incident light to the E-O probe 42.

$\Delta H$ is a distance that the E-O probe 42 is apart from the device 12 to be measured at the time of the preparation for the measurement. $\Delta H$ can arbitrarily be set, but $\Delta H$ must be large enough so that the E-O probe 42 does not interrupt the sight of the microscope as shown in FIG. 2.

$\Delta Z$ is the difference of the focal points of the microscope when the E-O probe 42 exists in the optical path and when the E-O probe 42 does not exist in the optical path. For example, a case of the E-O probe 42 made of ZnTe crystal and silica glass which is a support will be considered. In the case of ZnTe having the 2.9 refractive index and the 100 μm thickness and silica glass having the 1.5 refractive index and the 200 μm thickness, the practical optical path length $L_1$ is $L_1 = 2.9 \times 100 + 1.5 \times 200 = 590$ μm. In the case where the E-O probe 42 does not exist in the optical path, since the refractive index of air is 1 and the space is 300 μm, the optical length $L_2$ is $L_2 = 300$ μm. Accordingly, the focal point difference $\Delta Z$ in this case is $\Delta Z = L_1 - L_2 = 290$ μm.

$\Delta Z$ can be calculated if the structure of the E-O probe 42 and its size are known, but it can also be obtained by the following measurement. Instead of the device 12 to be measured, a sample for the $\Delta Z$ measurement is placed on the pedestal 11. The sample, which has a contrast which is large, may be a stripe electrode a few μm in width. First, the position of the probe stage 4 is set at $H_0 - \Delta H$, and the focus of the objective lens 31 of the microscope is adjusted to the sample, and the position $Z_1$ at this time is stored. Next, the microscope is raised enough for a moment, and the position of the probe stage 4 is set at $H_0$–a. At this time, a is at a level such that the E-O probe does not come into contact with the sample for the $\Delta Z$ measurement, for example, a few μm. In this condition, the focus of the objective lens 31 of the microscope is adjusted to the sample by looking at the sample through the E-O probe, and the position $Z_2$ at this time is stored.

The difference between $Z_1$ and $Z_2$ is the above-described focal point difference $\Delta Z$. Here, while measuring $Z_2$, the probe does not come into contact with the sample, but the focus of the objective lens 31 of the microscope is adjusted to the sample through the E-O probe, so that the condition is the same as (b) of FIG. 3.

(B) Measurement procedure

Referring to FIG. 2, the measurement procedure will be explained in order.

(1) Movement of the measuring point

In a case of moving the measuring point, the position of the probe stage 4 is set at $H_0 - \Delta H$ so that the E-O probe 42 does not come into contact with the device 12 to be measured. At this time, the focus of the microscope is adjusted by the automatic focusing function. Since the E-O probe 42 is separated from the device 12 at a distance of $\Delta H$, there is no danger of contact with each other. In this condition, the measuring point is determined by moving the microscope or the device 12 in a horizontal direction.

(2) Determination of the measuring point

Once the measuring point is determined, the focus of the device 12 is readjusted by the automatic focusing function in accordance with the instruction from the computer 62. That is, while the E-O probe 42 is substantially out of the optical path which observes the surface of the device 12, the focus of the microscope is adjusted. The image at this time is stored in the TV monitor 63 or in the computer 62.

(3) Preparation for the measurement

The Z-axis stage 22 is operated to raise the microscope system 3 by $\Delta Z$. At this time, the image of the device 12 by the microscope on the TV monitor 63 is blurred and cannot be seen.

(4) At measurement

The E-O probe 42 descends by $\Delta H$ and the position of the E-O probe 42 is set at $H_0$. At this time, the base of the E-O probe 42 comes into contact with the surface of the device 12. If the measurement is desired to be performed with the E-O probe 42 apart from the device 12 at a distance d, in the step of preparing for the measurement (3), the microscope system 3 may be raised by $\Delta Z + d$. At this time, if the surface of the device 12 is observed on the TV monitor 63 though the E-O probe 42, since the device 12 is apart from the focal point at a distance d, the image of the device 12 is blurred and cannot be seen. As the countermeasure for this, the image stored in the step (2) of determining the measuring point is displayed on the TV monitor.

(5) End of the measurement

The probe stage 4 is operated to raise the E-O probe 42 and the E-O probe 42 is positioned back to $H_0 - \Delta H$ for next measurement.

In the present embodiment, the position of the focal point of the microscope adjusted to the device 12 to be measured by using the automatic focusing function is used as the reference for determining the distance between the E-O probe 42 and the device 12 to be measured. In a case of a high magnification microscope, since the depth of field is narrow, the accuracy below 1 μm can easily be obtained. The E-O probe 42 is moved by the amount determined in the initialization, so that even though there is no sensor to detect the position of the probe, the E-O probe 42 can be placed near the device 12 at high accuracy.

Thus, as described above, according to the method of positioning the E-O probe, the peripheral systems can easily be constructed. Further, when the position of the E-O probe and the amount of the movement of the microscope are determined in the initialization, the device to be measured is not needed to be set, so that there is no danger of breaking the device.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A method of positioning an electrooptic (E-O) probe applied to an apparatus for the measurement of voltage, the probe and the apparatus including a magnifying optical system for observing a surface of a device to be measured in focus, an E-O probe, means for producing a laser beam for the measurement of voltage of said device, said laser beam being applied to said device in a state where said E-O probe approximates to said device, a probe stage for moving said E-O probe in a direction of an optical axis of said magnifying optical system against said magnifying optical system, and a Z-axis stage for moving said magnifying optical system, said E-O probe and said probe stage in a direction of the optical axis of said magnifying optical system against said device, said E-O probe being positioned against the surface of said device without contact with the surface of said device, said method of positioning said E-O probe comprising the steps of:

storing a first position of said E-O probe stage in a first condition of said magnifying optical system, focusing a base plane of said E-O probe, and calculating and storing a focal point difference between a position of a focal point of said magnifying optical system against said magnifying optical system in a second condition of said E-O probe substantially out of an optical path for observing the surface of said device and a first position of a focal point of said magnifying optical system against said magnifying optical system in said first condition;

adjusting the focus of said magnifying optical system to an observation position on said device;

separating said magnifying optical system, said E-O probe, and said probe stage from said device by said focal point difference by said Z-axis stage; and setting said probe stage in said first position.

2. A method of positioning an E-O probe of an apparatus for the measurement of voltage according to claim 1 further comprising the step of further separating said magnifying optical system, said E-O probe, and said probe stage from said device by a predetermined narrow space after said separating step by said Z-stage.

3. A method of positioning an E-O probe of an apparatus for the measurement of voltage according to claim 1 wherein said apparatus comprises storage means for storing images obtained through said magnifying optical system, and display means for outputting contents of the storage means.

4. A method of positioning an E-O probe of an apparatus for the measurement of voltage according to claim 3 further comprising a step of storing the image obtained after focus is adjusted in said second condition, and outputting the contents of the storage means to said display means, after said adjusting step.

5. A method of positioning an E-O probe of an apparatus for the measurement of voltage according to claim 1 wherein in the storing step, calculating said focal point difference is achieved by using a refractive index and a thickness of material constituting said E-O probe.

6. A method of positioning an E-O probe of an apparatus for the measurement of voltage according to claim 1 wherein in the storing step, calculating said focal point difference is achieved by obtaining the distance of said magnifying optical system moved by said Z-axis stage from the position where the focus of said magnifying optical system is adjusted to a sample placed at the position of said device in said second condition to the position where the focus of said magnifying optical system is adjusted to said sample through said E-O probe.

* * * * *